(12) United States Patent
Lee et al.

(10) Patent No.: US 12,532,629 B2
(45) Date of Patent: Jan. 20, 2026

(54) LIGHT EMITTING DISPLAY DEVICE

(71) Applicant: Samsung Display Co., LTD., Yongin-si (KR)

(72) Inventors: Sang Shin Lee, Yongin-si (KR); Sanghoon Kim, Hwaseong-si (KR); Jongsung Park, Hwaseong-si (KR); Sang Min Yi, Seoul (KR); Seung Jin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 334 days.

(21) Appl. No.: 18/099,171

(22) Filed: Jan. 19, 2023

(65) Prior Publication Data

US 2023/0263028 A1   Aug. 17, 2023

(30) Foreign Application Priority Data

Feb. 11, 2022   (KR) .................. 10-2022-0018078

(51) Int. Cl.
*H10K 59/35*   (2023.01)
*H10K 59/12*   (2023.01)

(52) U.S. Cl.
CPC .......... *H10K 59/353* (2023.02); *H10K 59/12* (2023.02); *H10K 59/352* (2023.02)

(58) Field of Classification Search
CPC ..... H10K 59/353; H10K 59/352; H10K 59/12
See application file for complete search history.

(56) References Cited

U.S. PATENT DOCUMENTS

2020/0403044 A1* 12/2020 Zhao .................... H10K 59/353
2021/0280644 A1   9/2021 Du et al.
2021/0359030 A1* 11/2021 Qiu ...................... H10K 71/164

FOREIGN PATENT DOCUMENTS

| CN | 112368840 A | 2/2021 |
|---|---|---|
| KR | 10-1347995 | 1/2014 |
| KR | 10-2016-0129688 A | 11/2016 |

* cited by examiner

*Primary Examiner* — Mary Ellen Bowman
(74) *Attorney, Agent, or Firm* — Womble Bond Dickinson (US) LLP

(57) ABSTRACT

A light emitting display device includes: a plurality of pixel areas including a first pixel area and a second pixel area adjacent to the first pixel area; a first unit pixel in the first pixel area; and a second unit pixel in the second pixel area, wherein the first unit pixel and the second unit pixel include a first pixel, a second pixel, and a third pixel each configured to display different colors, facing sides of the first pixel and the third pixel have complementary curved lines in the first unit pixel, facing sides of the second pixel and the third pixel have complementary curved lines in the first unit pixel, and facing sides of the first pixel of the first unit pixel and the second pixel of the second unit pixel have complementary curved lines.

20 Claims, 15 Drawing Sheets

LIGHT EMITTING DISPLAY DEVICE

CROSS-REFERENCE TO RELATED APPLICATION

The present application claims priority to and the benefit of Korean Patent Application No. 10-2022-0018078 filed in the Korean Intellectual Property Office on Feb. 11, 2022, the entire content of which is incorporated herein by reference.

BACKGROUND

1. Field

Aspects of some embodiments of the present disclosure relates to a display device.

2. Description of the Related Art

A light emitting display device includes light emitting diodes corresponding to pixels and may display images by controlling luminance of each light emitting diode. Unlike a light-receiving type of display device such as liquid crystal displays, the light emitting display device may not utilize a light source such as a backlight, so a thickness and weight may be reduced. In addition, the light emitting display device may have relatively as high luminance, a relatively high contrast ratio, relatively high color reproduction, and relatively high reaction speed, so that it may display relatively high-quality images.

Due to these merits, the light emitting display devices may be utilized with various electronic devices such as mobile devices such as smartphones and tablets, monitors, and televisions, and has been spotlighted as a display device for automobiles.

The above information disclosed in this Background section is only for enhancement of understanding of the background and therefore the information discussed in this Background section does not necessarily constitute prior art.

SUMMARY

Aspects of some embodiments of the present disclosure relates to a display device, and for example, to a light emitting display device including a light emitting diode.

According to some embodiments, the light emitting display device may display images by combining the pixels displaying different colors. Depending on the shape and arrangement of the pixels, the image quality, the resolution, the contrast ratio, the light emitting area, the luminance, the lifespan, etc. may vary.

Aspects of some embodiments include a light emitting display device capable of increasing a light emitting area and capable of improving display qualities such as contrast ratio.

According to some embodiments, a light emitting display device includes: a plurality of pixel areas including a first pixel area and a second pixel area adjacent to the first pixel area; a first unit pixel in the first pixel area; and a second unit pixel in the second pixel. According to some embodiments, the first unit pixel and the second unit pixel may include a first pixel, a second pixel, and a third pixel each configured to display different colors. According to some embodiments, facing sides of the first pixel and the third pixel have complementary curved lines in the first unit pixel, facing sides of the second pixel and the third pixel have complementary curved lines in the first unit pixel, and facing sides of the first pixel of the first unit pixel and the second pixel of the second unit pixel have complementary curved lines.

According to some embodiments, one of the facing sides may be a curved line that is concave with respect to a center of the pixel including the one of the facing sides, and another of the facing sides may be a curved line that is convex with respect to a center of the pixel including the another of the facing sides.

According to some embodiments, among the facing sides of the first pixel and the third pixel in the first unit pixel, the side of the first pixel may be a concave arc with respect to the center of the first pixel, and the side of the third pixel may be a convex arc with respect to the center of the third pixel. According to some embodiments, among the facing sides of the second pixel and the third pixel in the first unit pixel, the side of the second pixel may be a concave arc with respect to the center of the second pixel, and the side of the third pixel may be a convex arc with respect to the center of the third pixel. According to some embodiments, among the facing sides of the first pixel of the first unit pixel and the second pixel of the second unit pixel, the side of the first pixel may be a convex arc with respect to the center of the first pixel, and the side of the second pixel may be a concave arc with respect to the center of the second pixel.

According to some embodiments, curvature centers of the facing sides of the first pixel and the third pixel in the first unit pixel are the same, curvature centers of the facing sides of the second pixel and the third pixel in the first unit pixel may be the same, and curvature centers of the facing sides of the first pixel of the first unit pixel and the second pixel of the second unit pixel may be the same.

According to some embodiments, in the first unit pixel, a first interval between the first pixel and the third pixel may be equal to a second interval between the second pixel and the third pixel, and a third interval between the first pixel of the first unit pixel and the second pixel of the second unit pixel may be equal to the first interval.

According to some embodiments, the facing sides of the third pixel of the first unit pixel and the second pixel of the second unit pixel may be complementary curved lines.

According to some embodiments, among the facing sides of the third pixel of the first unit pixel and of the second pixel of the second unit pixel, the side of the third pixel may be a convex arc with respect to the center of the third pixel, and the side of the second pixel may be a concave arc with respect to the center of the second pixel.

According to some embodiments, a fourth interval between the third pixel of the first unit pixel and the second pixel of the second unit pixel may be equal to the first interval.

According to some embodiments, the plurality of the pixel areas may further include a third pixel area adjacent to the first pixel area in a horizontal direction, According to some embodiments, the light emitting display device further includes a third unit pixel in the third pixel area, the third unit pixel may include a first pixel, a second pixel, and a third pixel that display different colors, and the first pixel may be above the second pixel in the first pixel area, while the second pixel may be above the first pixel in the second pixel area.

According to some embodiments, the first pixel area and the third pixel area may be at a lower end among the plurality of pixel areas. According to some embodiments, the light emitting display may further include a second pixel spanning the third pixel area at the lower end.

According to some embodiments, a slit extending in an oblique direction may be formed in the third pixel.

According to some embodiments, the slit may be formed to divide the third pixel into two portions, or the slit may be formed to be recessed from one side or both facing sides of the third pixel.

According to some embodiments, the second pixel may be larger than the first pixel, and the third pixel may be larger than the second pixel.

According to some embodiments, the first pixel, the second pixel, and the third pixel may represent red, green, and blue respectively.

According to some embodiments, a light emitting display device includes: a first unit pixel in a first pixel area; and a second unit pixel in a second pixel area adjacent to the first pixel area. According to some embodiments, the first unit pixel and the second unit pixel include a first pixel, a second pixel, and a third pixel each displaying different colors, According to some embodiments, a first interval between the first pixel and the third pixel in the first unit pixel, a second interval between the second pixel and the third pixel in the first unit pixel, and a third interval between the first pixel of the first unit pixel and the second pixel of the second unit pixel are the same.

According to some embodiments, in the first unit pixel, facing sides of the first pixel and the third pixel may be complementary curved lines, and facing sides of the second pixel and the third pixel may be complementary curved lines. According to some embodiments, one of the facing sides may be a curved line that is concave to a center of the pixel including the one of the facing sides, and another of the facing sides may be a curved line that is convex to a center of the pixel including the other.

According to some embodiments, among the facing sides of the first pixel and the third pixel in the first unit pixel, the side of the first pixel may be a concave arc with respect to the center of the first pixel, and the side of the third pixel may be a convex arc with respect to the center of the third pixel. According to some embodiments, among the facing sides of the second pixel and the third pixel in the first unit pixel, the side of the second pixel may be a concave arc with respect to the center of the second pixel, and the side of the third pixel may be a convex arc with respect to the center of the third pixel.

According to some embodiments, curvature centers of the facing sides of the first pixel and the third pixel in the first unit pixel may be the same, and curvature centers of the facing sides of the second pixel and the third pixel in the first unit pixel may be the same.

According to some embodiments, facing sides of the third pixel of the first unit pixel and the second pixel of the second unit pixel may be complementary curved lines. According to some embodiments, among the facing sides of the third pixel of the first unit pixel and the second pixel of the second unit pixel, the side of the third pixel may be a convex arc with respect to a center of the third pixel, and the side of the second pixel may be a concave arc with respect to a center of the second pixel.

According to some embodiments, curvature centers of the facing sides of the third pixel of the first unit pixel and the second pixel of the second unit pixel may be the same.

According to some embodiments, a light emitting area of the light emitting display device may be increased and display qualities such as a contrast ratio may be relatively improved. Also, unless otherwise stated, the embodiments may provide an effect that may be recognized throughout the specification.

DETAILED DESCRIPTION

Figure 1:
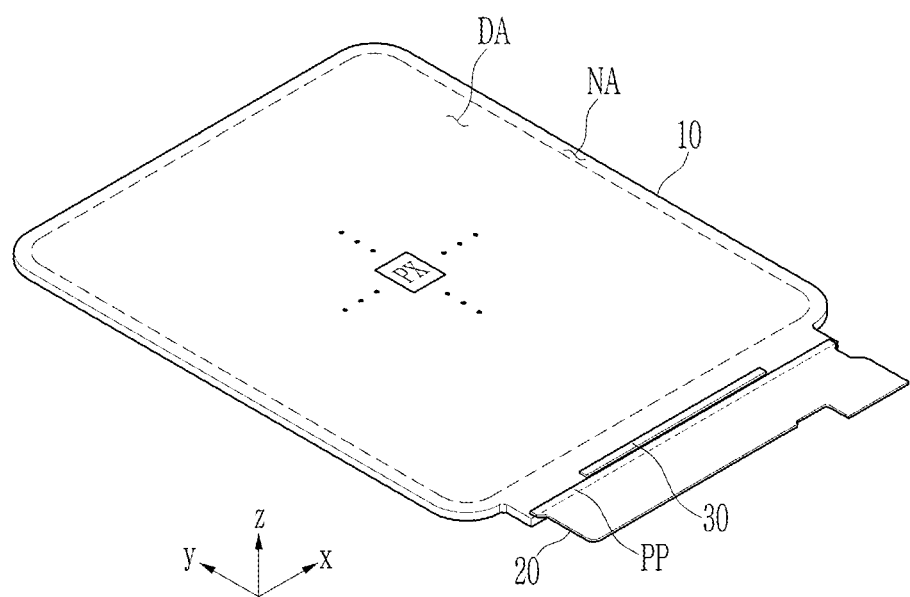
FIG. 1 is a perspective view schematically showing a light emitting display device according to some embodiments.

Embodiments will be described in detail with reference to accompanying drawings so that those skilled in the art belongs can easily implement them.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Throughout the specification, "connected" does not only mean that two or more constituent elements are directly connected, but when two or more constituent elements are connected indirectly through other constituent elements, and it may include a case where substantially integral parts are connected to each other even if they may be referred to by a different name depending on the position or function, as well as the case of being physically connected or electrically connected.

In the drawings, symbols "x", "y", and "z" representing directions are used, where "x" is a first direction, "y" is a second direction perpendicular to the first direction, and "z" is a third direction perpendicular to the first direction and the second direction.

FIG. 1 is a perspective view schematically showing a light emitting display device according to some embodiments.

Referring to FIG. 1, a light emitting display device (hereinafter, simply referred to as "a display device") may include a display panel 10, a flexible printed circuit film 20 bonded to the display panel 10, and a driving device including an integrated circuit chip 30, etc. The first direction x, the second direction y, and the third direction z may correspond to a horizontal direction, a vertical direction, and a thickness direction of the display device, respectively.

The display panel 10 may include a display area DA corresponding to a screen on which an image is displayed, and a non-display area NA where circuits and/or signal lines for generating and/or transmitting various signals applied to the display area DA are located. The non-display area NA may surround the display area DA.

In the display area DA of the display panel 10, the pixels PX may be located in a matrix. In addition, signal lines such as a gate line (also referred to as a scan line), a data line, and a driving voltage line may be located in the display area DA. Each pixel PX may be connected to the gate line, the data line, the driving voltage line, etc., and receive a gate signal (also called a scan signal), a data voltage, and a driving voltage (also called a first power voltage or a high potential power voltage) from these signal lines. The pixel PX may be a smallest unit capable of displaying contrast. One pixel PX may correspond to one light emitting region, and a planar shape of the pixel PX may be defined by the corresponding light emitting region. Each pixel PX may display any one of primary colors such as red, green, and blue. The pixel PX may be implemented by a light-emitting element such as a light emitting diode LED and a pixel circuit connected to the light-emitting element.

A touch sensor for detecting a user's contact and/or non-contact touch may be located in the display area DA. Although the display area DA, which is generally a quadrangle, is shown, the display area DA may have various shapes other than quadrangle, such as polygonal, circular, or oval.

In the non-display area NA of the display panel 10, a pad portion PP in which pads for receiving signals from the outside of the display panel 10 are arranged may be positioned. The pad portion PP may be positioned long in the first direction x along one edge of the display panel 10. The flexible printed circuit film 20 may be bonded to the pad portion PP, and the pads of the flexible printed circuit film 20 may be electrically connected to the pads of the pad portion PP.

A driving unit that generates and/or processes various signals for driving the display panel 10 may be positioned in the non-display area NA of the display panel 10. The driving unit includes a data driver that applies a data voltage to data lines, a gate driver that applies a gate signal to gate lines, and a signal controller that controls the data driver and the gate driver. The pixels PX may receive a data voltage at a timing (e.g., a set or predetermined timing) according to a gate signal generated by a gate driver. The gate driver may be integrated on the display panel 10 and positioned on at least one side of the display area DA. The data driver and the signal controller may be provided as an integrated circuit chip (also referred to as a driving IC chip) 30, and the integrated circuit chip 30 may be mounted in the non-display area NA of the display panel 10. The integrated circuit chip 30 may be mounted on a flexible printed circuit film 20 or the like and be electrically connected to the display panel 10.

Figure 2:
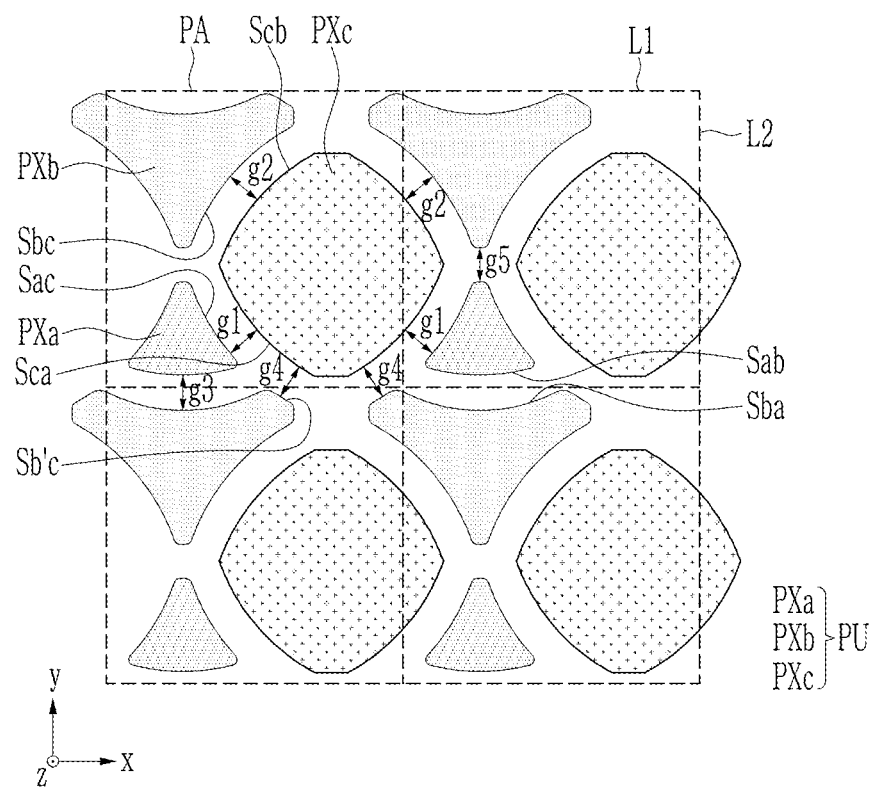
FIG. 2 is a top plan view showing a pixel arrangement in a light emitting display device according to some embodiments.

FIG. 2 is a top plan view showing a pixel arrangement in a light emitting display device according to some embodiments.

Referring to FIG. 2, four adjacent pixel areas PA and pixels PXa, PXb, and PXc located in each pixel area PA are shown. The pixel area PA may be repeatedly arranged along the first direction x and the second direction y.

The pixels PXa, PXb, and PXc may include a first pixel PXa, a second pixel PXb, and a third pixel PXc. The first pixel PXa, the second pixel PXb, and the third pixel PXc may each be a minimum unit capable of representing contrast. The first pixel PXa, the second pixel PXb, and the third pixel PXc may display different colors. For example, the first pixel PXa may display red, the second pixel PXb may display green, and the third pixel PXc may display blue. The second pixel PXb may be larger than the first pixel PXa, and the third pixel PXc may be larger than the second pixel PXb. The neighboring first pixel PXa, second pixel PXb, and third pixel PXc may constitute a unit pixel PU.

The first pixel PXa, the second pixel PXb, and the third pixel PXc may be arranged to be evenly distributed. As illustrated, the first pixel PXa and the second pixel PXb may be repeatedly arranged along the second direction y. The third pixel PXc may be arranged alternately with the first pixel PXa and the second pixel PXb along the first direction x. The third pixel PXc may be aligned with the region between the first pixel PXa and the second pixel PXb in the first direction x. For example, a line connecting the centers of the third pixels PXc adjacent in the first direction x may pass between the first pixel PXa and the second pixel PXb.

Each quadrangle region defined by the first dotted lines L1 extending in the first direction x and the second dotted lines L2 extending in the second direction y may correspond to one pixel area PA. The pixel area PA may be a rectangle having a first width in the first direction x and a second width in the second direction y. As the pixel density increases, each pixel area PA may be reduced.

A unit pixel PU may be located in each pixel area PA. Accordingly, one pixel area PA may correspond to a region in which one unit pixel PU is located. The pixel density may mean the number of the unit pixels PU per inch. The unit pixel PU may be composed of the first pixel PXa, the second pixel PXb, and the third pixel PXc. In the pixel area PA, the first pixel PXa, the second pixel PXb, and the third pixel PXc may be arranged into a triangle. That is, by connecting the centers of the first pixel PXa, the second pixel PXb, and the third pixel PXc constituting the unit pixel PU, a triangle may be drawn. One side of the triangle may be parallel to the second direction y, and two sides of the triangle may be inclined for the first direction x and the second direction y. In each pixel area PA, three pixel circuits for driving the first pixel PXa, the second pixel PXb, and the third pixel PXc respectively may also be located.

A part of the unit pixel PU may be positioned in the adjacent pixel area PA beyond the corresponding pixel area PA. For example, most of the second pixel PXb is positioned in the corresponding pixel area PA, but a part of the second pixel PXb may be positioned in the adjacent pixel area PA in the first direction x. Similarly, most of the third pixel PXc is positioned in the corresponding pixel area PA, but a part of the third pixel PXc may be positioned in the adjacent pixel area PA in the first direction x. In the second pixel PXb or the third pixel PXc, the portion positioned in the adjacent pixel area may be about 30% or less, about 20% or less, or about 10% or less of the entire area. In this way, the unit pixel PU is positioned in one pixel area PA, but the second pixel PXb and the third pixel PXc, which have the relatively large areas, may include a part that is out of their pixel area PA and is positioned in the pixel area PA adjacent in the first direction x. By designing a part of the unit pixel PU to be positioned in the adjacent pixel area PA, the emission area of the pixels PXa, PXb, and PXc may be maximized while maintaining the minimum distance between the pixels PXa, PXb, and PXc, thereby improving the luminance and/or lifespan of the display device.

The first pixel PXa, the second pixel PXb and the third pixel PXc may each be roughly polygonal as a whole. For example, the first pixel PXa may be approximately triangular or approximately sectoral, and vertices may be rounded. The second pixel PXb may have an approximately heptagonal, an approximately pentagonal, an approximately triangular, or an approximately triangular swimsuit shape, and may have rounded vertices. The third pixel PXc may be approximately hexagonal, approximately rhombus-shaped, or approximately diamond-shaped.

The first pixel PXa, the second pixel PXb, and the third pixel PXc may each include the sides that are curved lines. The first pixel PXa may include the concave sides and convex sides with respect to the center. The second pixel PXb may include n sides concave with respect to the center. The third pixel PXc may include the sides convex about the center. The sides facing between the adjacent pixels PXa, PXb, and PXc may be curved lines. For example, the first pixel PXa may include a curved line side Sac facing the third pixel PXc, and the third pixel PXc may include a curved line side Sca facing the first pixel PXa. The side Sac of the first pixel PXa and the side Sca of the third pixel PXc may face each other in a direction forming an angle of about 30° to about 60° with respect to the first direction x. The second pixel PXb may include a curved line side Sbc facing the third pixel PXc, and the third pixel PXc may include a curved line side Scb facing the second pixel PXb. The side Sbc of the second pixel PXb and the side Scb of the third pixel PXc may face each other in a direction forming an angle of about 120° to about 150° with respect to the first direction x. The first pixel PXa may include a curved line side Sab facing the second pixel PXb, and the second pixel PXb may include a curved line side Sba facing the first pixel PXa. The side Sab of the first pixel PXa and the side Sba of the second pixel PXb may face each other in the approximate second direction y.

The side Sac of the first pixel PXa and the side Sca of the third pixel PXc may be complementary curved lines. Here, that the sides are the complementary curved lines means that when one side is a curved line concave with respect to the center of the pixel, the other side is a curved line convex with respect to the center of the pixel. The side Sac of the first pixel PXa may be a concave arc, and the side Sca of the third pixel PXc may be a convex arc. The side Sac of the first pixel PXa and the side Sca of the third pixel PXc may be spaced apart by a first interval g1 while having a substantially same center of curvature. The side Sac of the first pixel PXa and the side Sca of the third pixel PXc may be arcs spaced apart by the first interval g1 while having the same curvature center. The first interval g1 may correspond to the distance between the first pixel PXa and the third pixel PXc. Unlike the illustration, the side Sac of the first pixel PXa may be a convex arc, and the side Sca of the third pixel PXc may be a concave arc.

The side Sbc of the second pixel PXb and the side Scb of the third pixel PXc may be complementary curved lines. The side Sbc of the second pixel PXb may be a concave arc, and the side Scb of the third pixel PXc may be a convex arc. The side Sbc of the second pixel PXb and the side Scb of the third pixel PXc may be spaced apart by a second interval g2 while having substantially the same curvature center. The side Sbc of the second pixel PXb and the side Scb of the third pixel PXc may be arcs spaced apart by a second interval g2 while having substantially the same curvature center. The second interval g2 may correspond to the distance between the second pixel PXb and the third pixel PXc. Unlike the illustration, the side Sbc of the second pixel PXb may be a convex arc, and the side Scb of the third pixel PXc may be a concave arc.

The side Sab of the first pixel PXa of one unit pixel PU and the side Sba of the second pixel PXb of the unit pixel PU adjacent thereto may be the complementary curved lines. The side Sab of the first pixel PXa may be a convex arc, and the side Sba of the second pixel PXb may be a concave arc. The side Sab) of the first pixel PXa and the side Sba of the second pixel PXb may be spaced apart by a third interval g3 while having substantially the same curvature center. The side Sab of the first pixel PXa and the side Sba of the second pixel PXb may be arcs spaced apart by the third interval g3 while having substantially the same curvature center. The third interval g3 may correspond to the distance between the first pixel PXa and the second pixel PXb. Unlike the illustration, the side Sab of the first pixel PXa may be a concave arc, and the side Sba of the second pixel PXb may be a convex arc.

The side Sca of the third pixel PXc of one unit pixel PU and the side Sb'c of the second pixel PXb of the adjacent unit pixel PU may be complementary curved lines. The side Sca of the third pixel PXc may be a convex arc, and the side Sb'c of the second pixel PXb may be a concave arc. The side Sca of the third pixel PXc and the side Sb'c of the second pixel PXb may be spaced apart by a fourth interval g4 while having substantially the same curvature center. The side Sca of the third pixel PXc and the side Sb'c of the second pixel PXb may be arcs spaced apart by the fourth interval g4 while having substantially the same curvature center. The fourth interval g4 may correspond to the distance between the first pixel PXa and the second pixel PXb respectively positioned in the adjacent pixel areas PA. The side Sb'c of the second pixel PXb may have the same curvature center as the side Sac of the first pixel PXa. As the second pixel PXb of the adjacent unit pixel PU includes the complementary curved line side Sb'c for the side Sca of the third pixel PXc, the size of the second pixel PXb may be maximized. Unlike the illustration, the side Sca of the third pixel PXc may be a concave arc, and the side Sb'c of the second pixel PXb may be a convex arc.

The above relationship may be equally applied between the pixels PXa, PXb, and PXc of the unit pixels PU adjacent in the first direction x and the second direction y. Meanwhile, the curvature centers of the sides of the adjacent pixels PXa, PXb, and PXc may not be the same.

In one unit pixel PU, the first pixel PXa and the second pixel PXb may be spaced apart by a fifth interval g5. The fifth interval g5 may correspond to the distance between the first pixel PXa and the second pixel PXb within one pixel area PA. The first interval g1, the second interval g2, the third interval g3, the fourth interval g4, and the fifth interval g5 may correspond to an interval between the adjacent pixels PXa, PXb, and PXc. The first interval g1, the second interval g2, the third interval g3, the fourth interval g4, and/or the fifth interval g5 may be substantially the same, but may be different.

According to some embodiments, the area (aperture ratio) of each pixel PXa, PXb, and PXc may be increased by turning the sides facing between the adjacent pixels PXa, PXb, and PXc into the curved lines. For example, in the display device with the pixel density of 152 ppi and the interval of 17.7 μm between the pixels PXa, PXb, and PXc, in a comparative example in which the sides of the pixels PXa, PXb, and PXc are designed with straight lines, and in the embodiments where the facing sides are designed with curved lines, an aperture ratio of each pixel PXa, PXb, and PXc is as shown in Table 1 below.

TABLE 1

|  | Pixel density (ppi) | Pixel interval (μm) | First pixel aperture ratio (%) | Second pixel aperture ratio (%) | Third pixel aperture ratio (%) |
| --- | --- | --- | --- | --- | --- |
| Comparative Example | 152 | 17.7 | 18.58 | 52.25 | 113.26 |
| Embodiment | 152 | 17.7 | 19.12 | 52.93 | 116.54 |

As above, for the same pixel density and pixel interval, in the display device according to some embodiments, it was found that the aperture ratio of the first pixel PXa and the aperture ratio of the second pixel PXb were both increased as well as the aperture ratio of the third pixel PXc compared to the display device according to the comparative example. Therefore, the luminance of the pixels PXa, PXb, and PXc may be improved. In addition, if the aperture ratio is increased, even if the amount of light per unit area of the pixels PXa, PXb, and PXc is reduced, the pixels PXa, PXb, and PXc may provide the same level of luminance, so the lifetime of the pixels PXa, PXb, and PXc may be improved. Meanwhile, the interval between the adjacent pixels PXa, PXb, and PXc is set or predetermined in consideration of process conditions (e.g., an alignment margin of a fine metal mask (hereinafter referred to as "FMM") for depositing the emission layer of each pixel PXa, PXb, and PXc using the FMM. Therefore, according to some embodiments, the emission layer may be formed with a stable thickness while increasing the aperture ratio of the pixels PXa, PXb, and PXc, thereby preventing or reducing the luminance difference from occurring in the pixels PXa, PXb, and PXc. As the sides facing between the pixels PXa, PXb, and PXc are formed of the curved lines, each pixel PXa, PXb, and PXc does not include the side parallel to the second direction y or has the side of a very short length even if it is included. If the sides of the pixels PXa, PXb, and PXc are parallel to the second direction y, which is the vertical direction, a scattered light that is incident from the outside to the display device is diffusely reflected by the side of the pixels PXa, PXb, and PXc (in further detail, a curved portion of a common electrode formed along a curved surface of a bank to be described later) may be recognized by the user. In particular, the diffusely reflected and scattered light is easily recognized by being positioned within the user's field of view because the user looks the display device positioned in the central portion of the vehicle from the side rather than the front. This may deteriorate display qualities such as a contrast ratio and sharpness of the display device. According to some embodiments, if the sides of the pixels PXa, PXb, and PXc are formed of the curved lines, the sides may be arranged such that they are not parallel to the second direction y. Accordingly, even if the external light is diffusely reflected by the sides of the pixels PXa, PXb, and PXc, the scattered light may be switched to a direction out of the user's field of view, for example, upward or downward of the user's field of view. Therefore, it may be possible to improve the display quality by preventing or reducing the mixing of the scattered light with the light emitted from the pixels PXa, PXb, and PXc.

Figure 3:
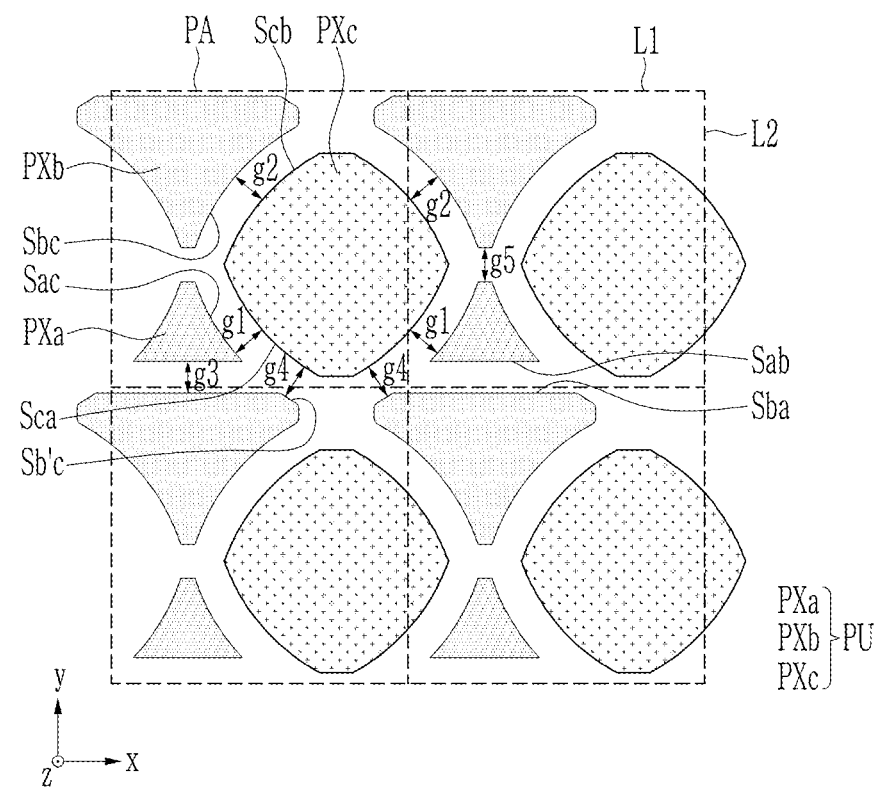
FIG. 3 is a top plan view showing a pixel arrangement in a light emitting display device according to some embodiments.

FIG. 3 is a top plan view showing a pixel arrangement in a light emitting display device according to some embodiments.

Referring to FIG. 3, compared with the above-described embodiments, there is a difference in that the sides facing the first pixel PXa and the second pixel PXb are the straight lines. For example, the side Sab of the first pixel PXa of one unit pixel PU and the side Sba of the second pixel PXb of the adjacent unit pixel PU may be the straight lines and may be parallel to the first direction x. If the sides of the pixels PXa, PXb, and PXc are arranged such that they are parallel to the first direction x, the scattered light diffusely reflected by the sides may be difficult to be recognized by the user. Therefore, the overall shape of the pixels PXa, PXb, and PXc is designed similarly to the embodiments shown with respect to FIG. 2, but the sides that may be formed parallel to the first direction x may be designed as a straight line if necessary. Even if the side Sab of the first pixel PXa and the side Sba of the second pixel PXb are the straight lines, the aperture ratio of the pixels may be maximized by setting the third interval g3 between them to be substantially equal to the first interval g1 and/or the second interval g2.

Meanwhile, the facing sides of the first pixel PXa and the second pixel PXb in one unit pixel PU may be the straight line and may be parallel to the first direction x. In this case, since the fifth interval g5 between the first pixel PXa and the second pixel PXb may be widened while minimizing the sacrifice of the aperture ratio of the first pixel PXa and the second pixel PXb, it may be desirable to secure a space to form a spacer (a structure supporting the FMM).

Figure 4:
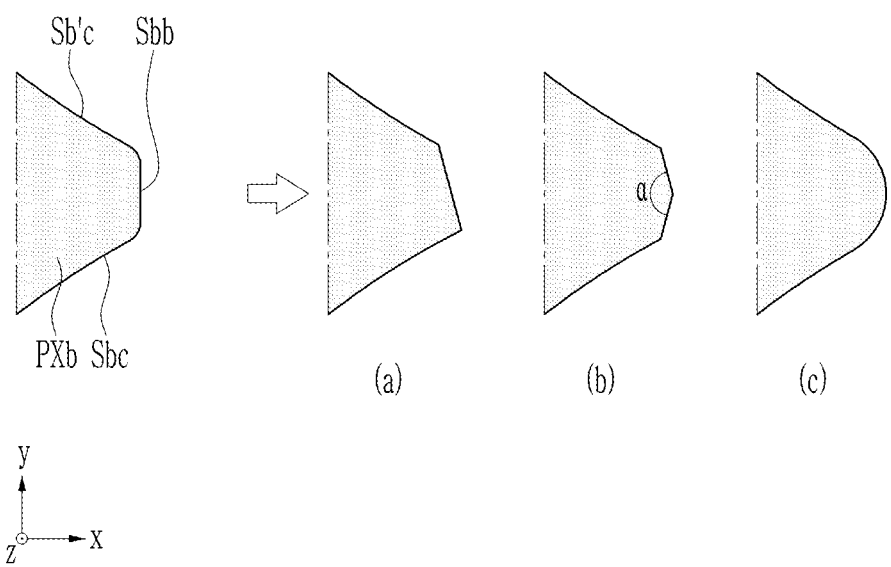
FIG. 4 is an enlarged view of a corner portion of one pixel in a light emitting display device according to some embodiments.

FIG. 4 is an enlarged view of a corner portion of one pixel in a light emitting display device according to some embodiments.

Referring to FIG. 4, the right corner of the second pixel PXb among the pixels PXa, PXb, and PXc is shown. The second pixel PXb may include the side Sbb parallel to the second direction y. Although the proportion of the side Sbb in the entire sides of the second pixel PXb is low, the scattered light diffusely reflected by the side Sbb may be positioned within the user's field of view. In order to minimize the deterioration of the image quality due to the side Sbb, the side Sbb may be formed as an oblique line as shown in FIG. 4 (a), as a two-stage oblique line forming an angle α as shown in FIG. 4 (b), or as a curved line as shown in FIG. 4 (c). In FIG. 4 (a), the oblique line may be inclined by about 15° or more with respect to the second direction y. In FIG. 4 (b), the angle α between the oblique lines may be about 150° or less. For example, if the side is inclined more than about 15° with respect to the second direction y, the probability that the diffusely reflected and scattered light is positioned within the user's field of view may be significantly reduced. In this way, by changing the side that is parallel to the second direction y, it may affect the user due to the diffuse reflection to be the oblique and/or curved line, so the effect of the diffuse reflection can be minimized.

Although the second pixel PXb was described as an example, the shape of the corner portion as above may be applied to the first pixel PXa and the third pixel PXc in the same way.

Figure 5:
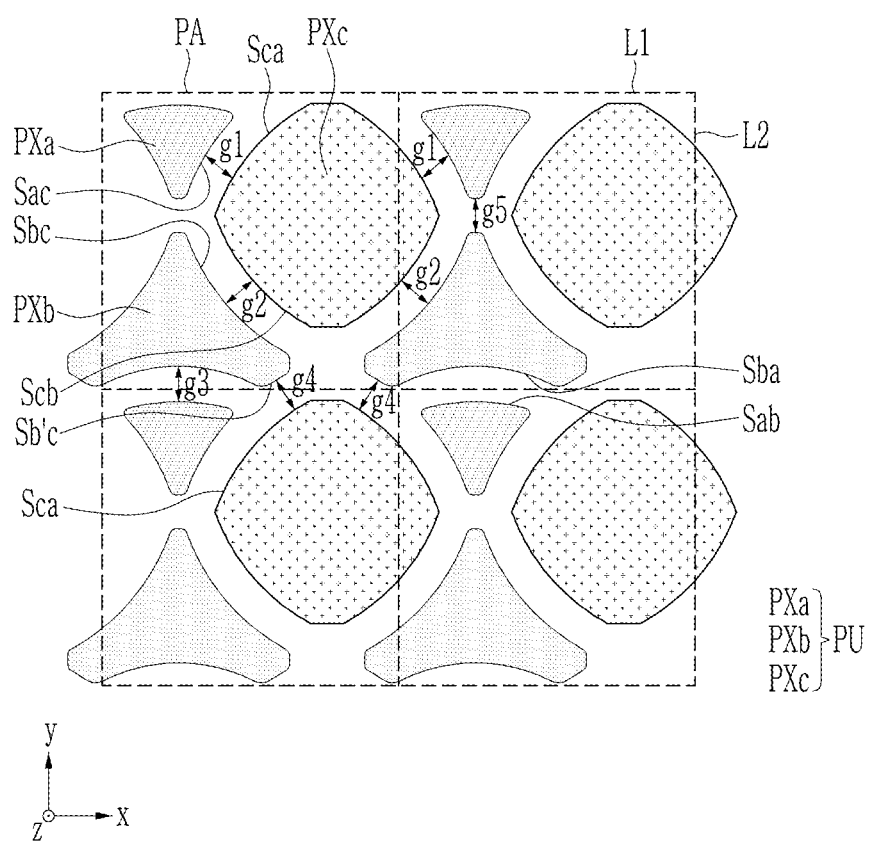
FIG. 5 is a top plan view showing a pixel arrangement in a light emitting display device according to some embodiments.

FIG. 5 is a top plan view showing a pixel arrangement in a display device according to some embodiments.

Referring to FIG. 5, there is a difference from the above-described embodiments in arrangement of the first pixel PXa and the second pixel PXb. Specifically, the unit pixel PU may include the first pixel PXa, the second pixel PXb, and the third pixel PXc, and in each pixel area PA, the first pixel PXa may be positioned above the second pixel PXb. Even if the positions of the first pixel PXa and the second pixel PXb are changed along the second direction y, as described above, for the pixels PXa, PXb, and PXc, the facing sides (e.g., Sac and Sca; Sbc and Scb; Sab and Sba; Sb'c and Sca) of the adjacent pixels PXa, PXb, and PXc may be formed as complementary curved lines. Also, the adjacent pixels PXa, PXb, and PXc may be spaced apart from each other by a first interval g1, a second interval g2, a third interval g3, a fourth interval g4, and a fifth interval g5. Accordingly, it may be possible to increase the aperture ratio of the pixels PXa, PXb, and PXc, and to prevent or reduce deterioration of the image quality due to the diffused reflection of the external light.

Figure 6:
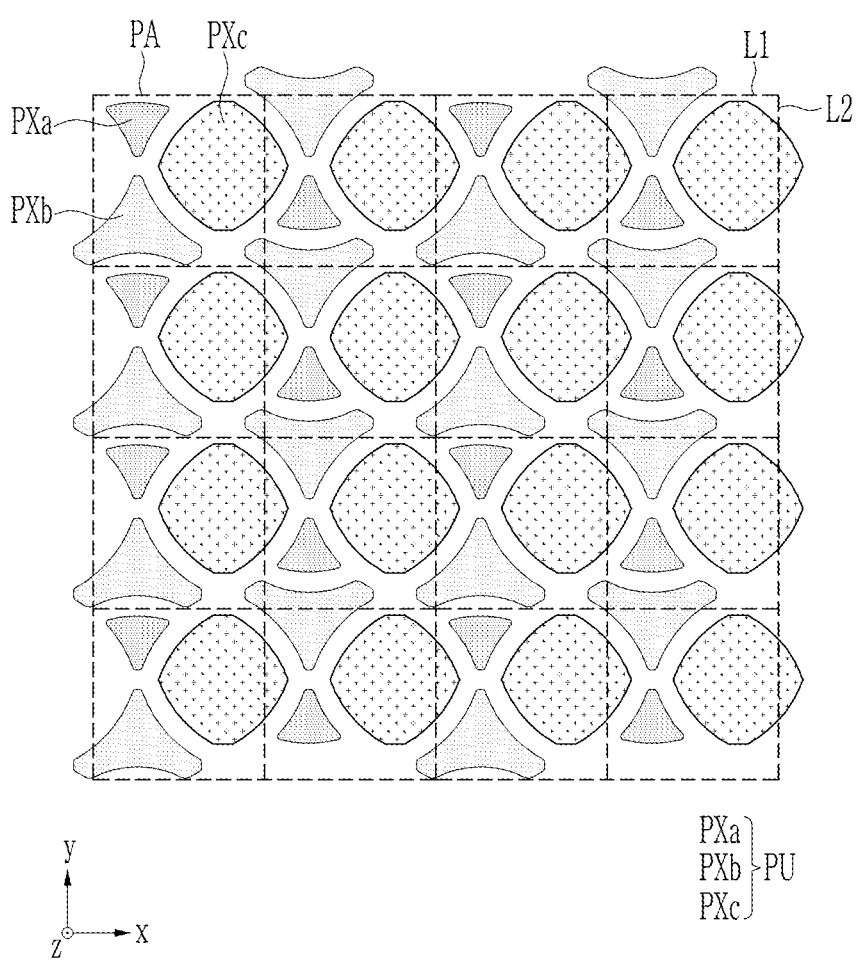
FIG. 6, FIG. 7, and FIG. 8 are top plan views showing a pixel arrangement in a light emitting display device according to some embodiments, respectively.
Figure 7:
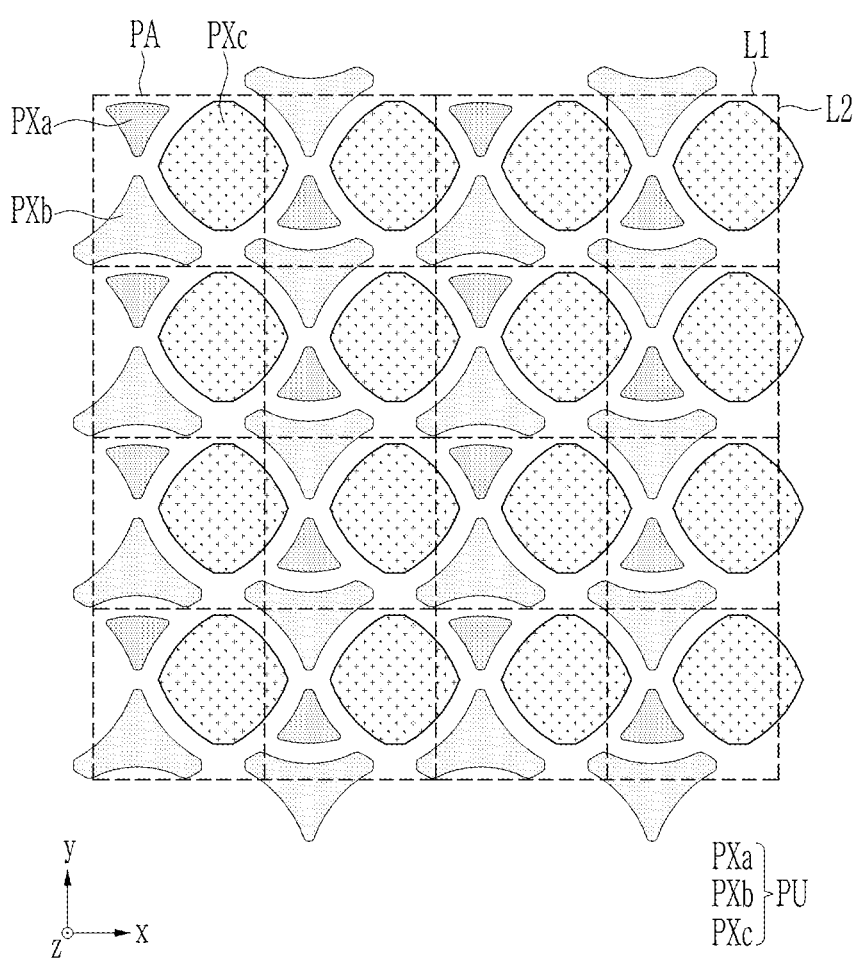
Figure 8:
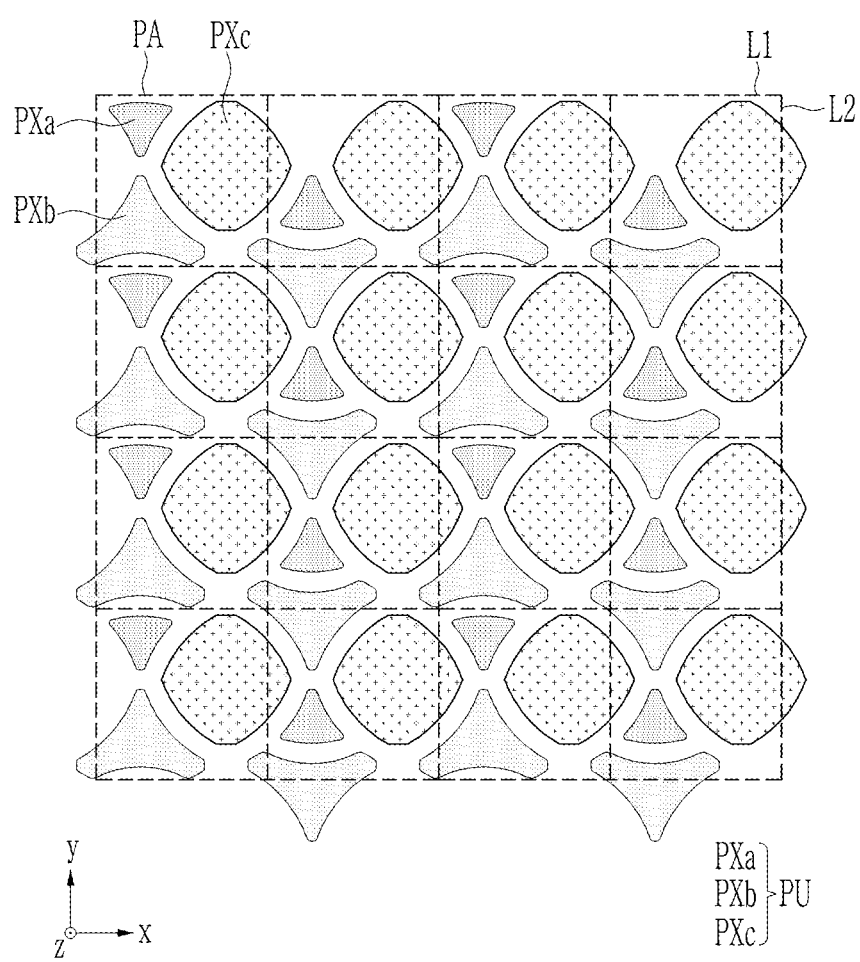

FIG. 6, FIG. 7, and FIG. 8 are top plan views showing a pixel arrangement in a light emitting display device according to some embodiments, respectively.

Referring to FIG. 6, the sixteen adjacent pixel areas PA and the pixels PXa, PXb, and PXc located in each pixel area PA are shown. From the left, the arrangement of the pixels PXa, PXb, and PXc positioned in the odd-numbered pixel area PA may be different from the arrangement of the pixels PXa, PXb, and PXc positioned in the even-numbered pixel area PA. Specifically, in the odd-numbered pixel area PA, the first pixel PXa may be positioned above the second pixel PXb, and in the even-numbered pixel area PA, the second pixel PXb may be positioned above the first pixel PXa. Contrary to the illustration, in the odd-numbered pixel area PA, the second pixel PXb may be positioned above the first pixel PXa, and in the even-numbered pixel area PA, the first pixel PXa may be positioned above the second pixel PXb. In this way, even if the positions of the first pixel PXa and the second pixel PXb are alternately arranged, the sides (e.g., Sac and Sca; Sbc and Scb; Sab and Sba; Sb'c and Sca) facing between the adjacent pixels PXa, PXb, and PXc may be formed as the complementary curved lines. Therefore, it may be possible to increase the aperture ratio of the pixels PXa, PXb, and PXc and to prevent or reduce deterioration of the image quality due to the diffused reflection of the external light.

Referring to FIG. 7, compared with the embodiments shown with respect to FIG. 6, the second pixels PXb are further located at the lower end of the pixel areas PA. When the positions of the first pixel PXa and the second pixel PXb are alternately arranged according to the design rule according to some embodiments, most of the second pixel PXb corresponding to the even-numbered pixel area PA on the left may be positioned in the pixel area PA. Accordingly, the area of the second pixels PXb at the lower end of the pixel areas PA may decrease, and thus the luminance of the second pixels PXb may decrease at the lower end of the pixel areas PA. The luminance deterioration of the second pixels PXb may be compensated at the lower end of the pixel areas PA by adding the second pixels PXb to the lower end of the pixel areas PA, for example from the left over the even-numbered pixel areas PA. Contrary to the illustration, when the second pixel PXb is positioned above the first pixel PXa in the odd-numbered pixel area PA, and the first pixel PXa is positioned above the second pixel PXb in the even-numbered pixel area PA, the second pixels PXb may be added to span the odd-numbered pixel areas PA in the lower end of the pixel areas PA.

Referring to FIG. 8, compared with the embodiments shown with respect to FIG. 7, a part of the second pixels PXb positioned on the upper end of the pixel areas PA, that is, the second pixels PXb corresponding to the even-numbered pixel areas PA from the left, are deleted. When the positions of the first pixel PXa and the second pixel PXb are alternately arranged according to the design rule according to some embodiments, at the upper end of the pixel areas PA, the second pixels PXb corresponding to the even-numbered pixel areas PA may be formed or arranged to protrude in the second direction y. Accordingly, for example, when only the second pixels PXb emit light from the upper part of the pixel areas PA, the upper edge may be displayed to be jagged. This problem may be rectified by eliminating the protruded second pixels PXb. Contrary to the illustration, when the second pixel PXb is positioned above the first pixel PXa in the odd-numbered pixel area PA, and the first pixel PXa is positioned above the second pixel PXb in the even-numbered pixel area PA, the second pixels PXb corresponding to the odd-numbered pixel areas PA may be deleted at the upper end of the pixel areas PA.

FIG. 9, FIG. 10, FIG. 11, FIG. 12, and FIG. 13 are top plan views showing a pixel arrangement in a light emitting display device according to some embodiments, respectively.

Figure 9:
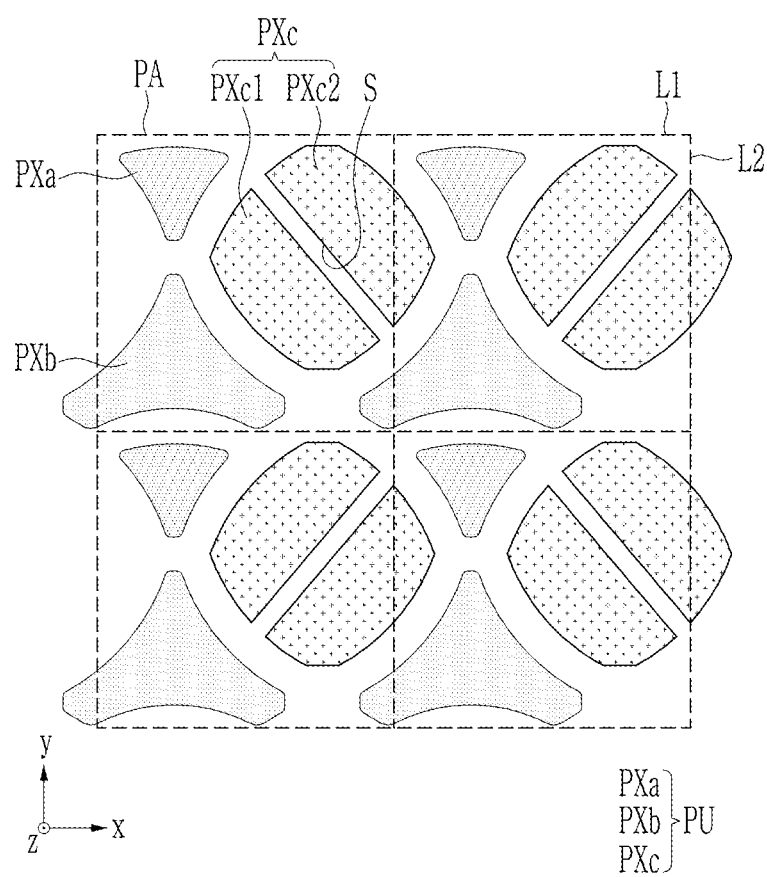
FIG. 9, FIG. 10, FIG. 11, FIG. 12, and FIG. 13 are top plan views showing a pixel arrangement in a light emitting display device according to some embodiments, respectively.

Referring to FIG. 9, unlike the first pixel PXa and the second pixel PXb having a single solid shape, the third pixel PXc may be divided into a first portion PXc1 and a second portion PXc2. That is, the third pixel PXc may be divided into two portions PXc1 and PXc2 by a slit S (or an opening) crossing the third pixel PXc. A slit corresponding to the slit S may be formed in the pixel electrode constituting the light emitting diode LED implementing the third pixel PXc, and the slit of the pixel electrode may be covered by a barrier rib. The first portion PXc1 and the second portion PXc2 may be connected to the same pixel circuit.

Gas may be generated from an insulating layer including an organic insulating material such as a planarization layer of the display panel, the gas propagates to the pixels PXa, PXb, and PXc and may cause shrinkage that reduces the emission regions of the pixels PXa, PXb, and PXc by denaturing or degrading the emission layers of the pixels PXa, PXb, and PXc. The third pixel PXc may be formed in a relatively large area, and the gas generated in the region overlapping the pixel electrode constituting the third pixel PXc, particularly the gas generated in the region overlapping the center of the pixel electrode, is blocked by the pixel electrode, so it may be difficult to escape during the manufacturing of the display panel. By forming the slit on the pixel electrode corresponding to the slit S that passes approximately the center of the third pixel PXc, the gas discharge may be smoothed through the slit, so the shrinkage may be suppressed.

When the third pixel PXc is approximately diamond-shaped, it may be desirable for the slit S to be formed in an oblique direction in the area of the third pixel PXc. For example, when the slit S having a predetermined width is formed in the first direction x or the second direction y, the area of the third pixel PXc may be further reduced compared to when the slit S is formed in the diagonal direction.

Figure 10:
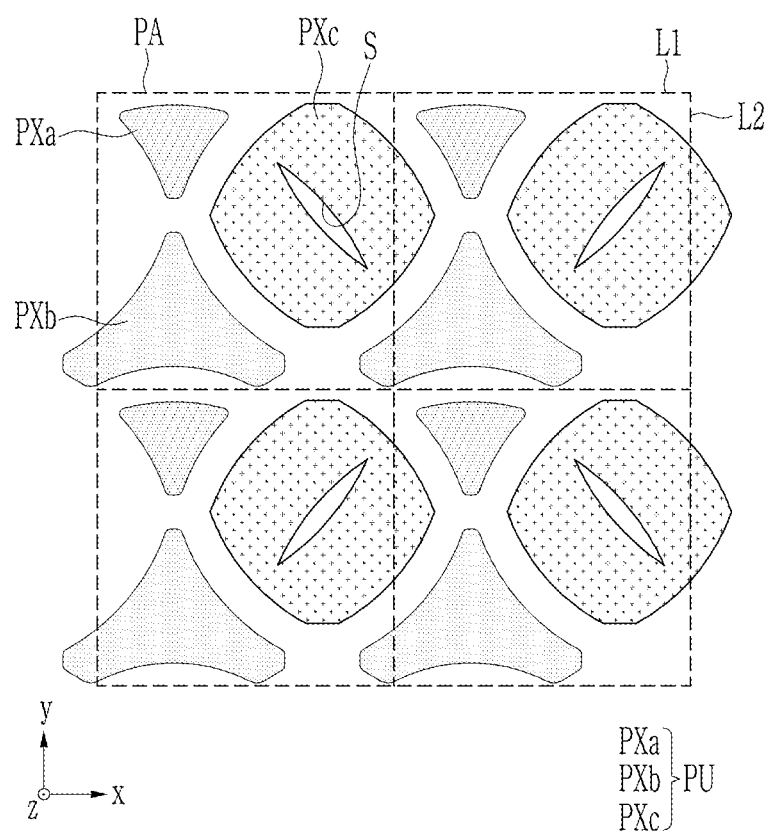
Figure 11:
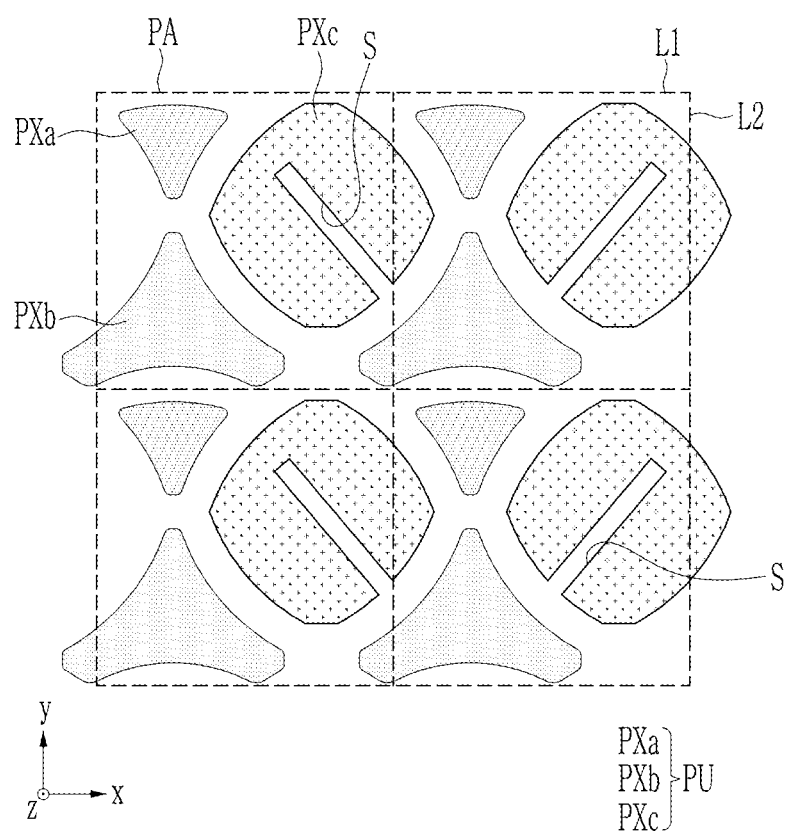
Figure 12:
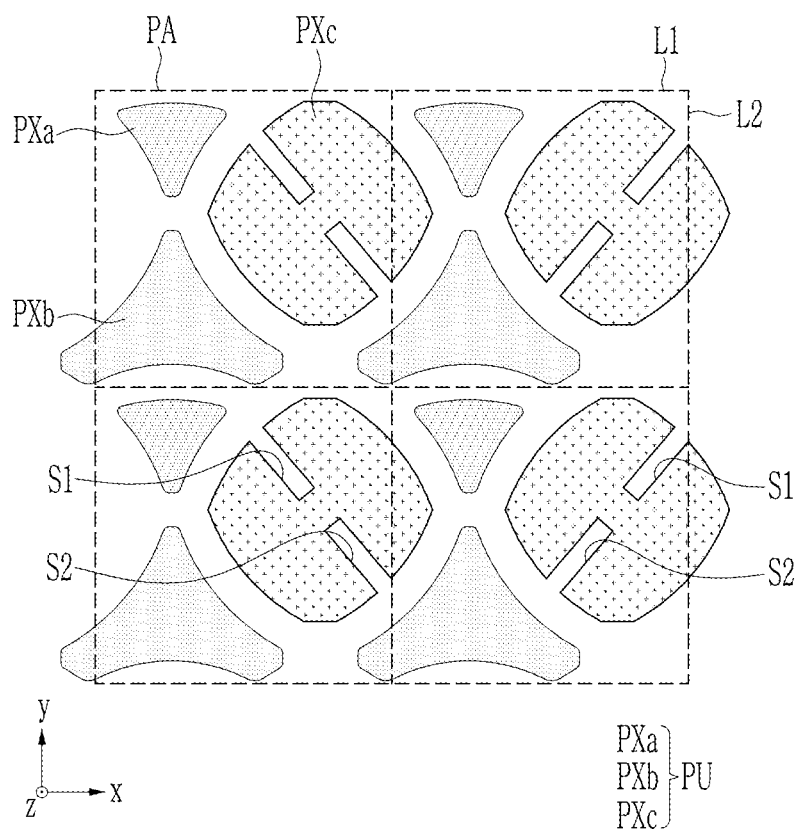
Figure 13:
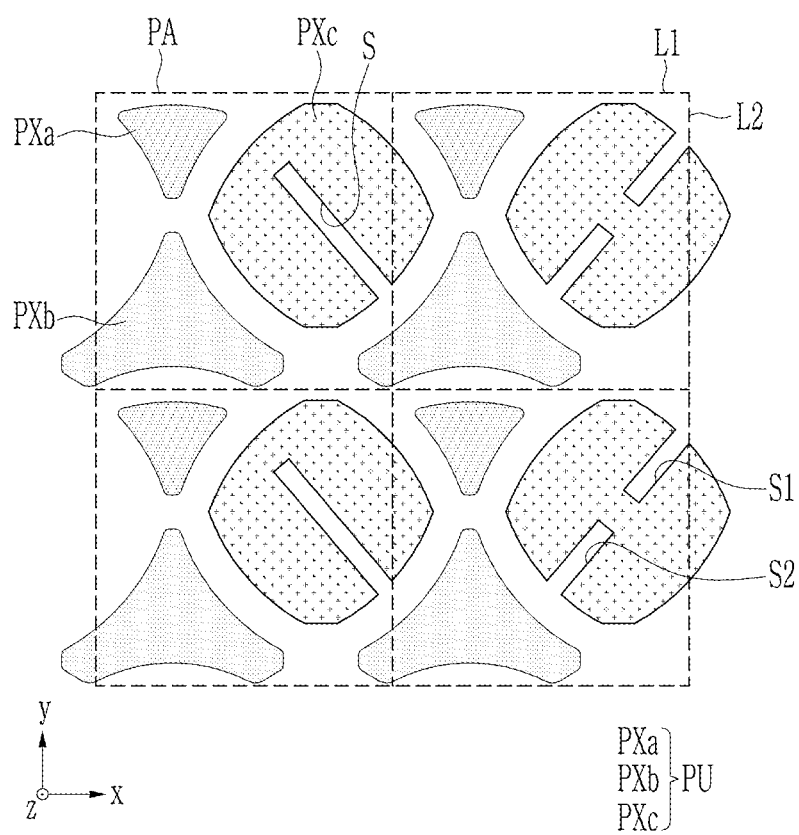

The slit S may be formed not to completely divide the third pixel PXc into two portions. For example, as shown in FIG. 10, the slit S may be formed in the oblique direction within the third pixel PXc, and the third pixel PXc may not be separated on both ends of the slit S. The slit S, as shown in FIG. 11, may be formed of a shape that is indented in the oblique direction from one side the third pixel PXc, and the third pixel PXc may not be separated on one end of the slit S. As shown in FIG. 11, slits S1 and S2 may be formed to be recessed from both sides facing of the third pixel PXc in the center direction, and the third pixel PXc may not be separated on the center.

The slit S may be formed differently between the third pixels PXc. For example, referring to FIG. 13, in some third pixel PXc, the slit S may be formed of a shape that is recessed in the oblique direction from one side, and in some third pixel PXc, the slit S1 and S2 may be formed of a shape that is indented in the central direction from both facing sides of the third pixel PXc.

Figure 14:
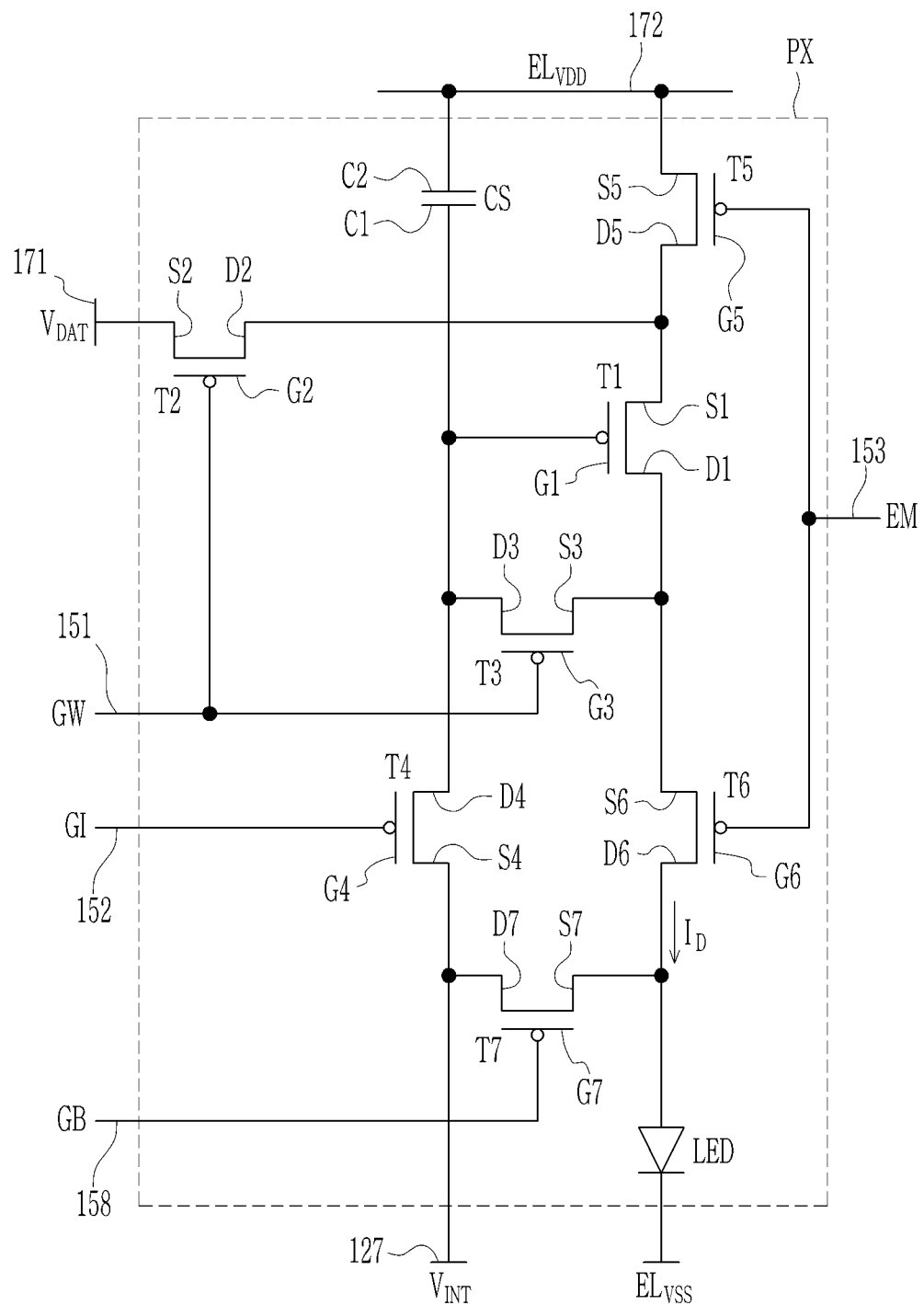
FIG. 14 is a circuit diagram of one pixel of a light emitting display device according to some embodiments.

FIG. 14 is a circuit diagram of one pixel of a light emitting display device according to some embodiments.

Referring to FIG. 14, the pixel PX may include transistors T1 to T7, a storage capacitor CS, and a light emitting diode LED, which are connected to signal lines 127, 151, 152, 153, 158, 171, and 172. The above-described pixels PXc, PXb, and PXc may have a planar shape corresponding to a light emitting region of the light emitting diode LED.

The transistors T1 to T7 may include a driving transistor T1, a switching transistor T2, a compensation transistor T3, an initialization transistor T4, an operation control transistor T5, a light emitting control transistor T6, and a bypass transistor T7.

The signal lines 127, 151, 152, 153, 158, 171, and 172 may include an initialization voltage line 127, a scan line 151, a previous scan line 152, a light emitting control line 153, a bypass control line 158, a data line 171, and a driving voltage line 172.

The scan line 151 may transmit a scan signal GW to the switching transistor T2 and the compensation transistor T3. The previous scan line 152 may transmit a previous scan signal GI to the initialization transistor T4. The light emitting control line 153 may transmit a light emitting control signal EM to the operation control transistor T5 and the light emitting control transistor T6. The bypass control line 158 may transmit a bypass signal GB to the bypass transistor T7. The bypass control line 158 may connected to the previous scan line 152.

The data line 171 may receive a data voltage VIAL and the driving voltage line 172 and the initialization voltage line 127 may receive a driving voltage $EL_{VDD}$ and an initialization voltage VINT. The initialization voltage VINT may initialize the driving transistor T1.

Figure 15:
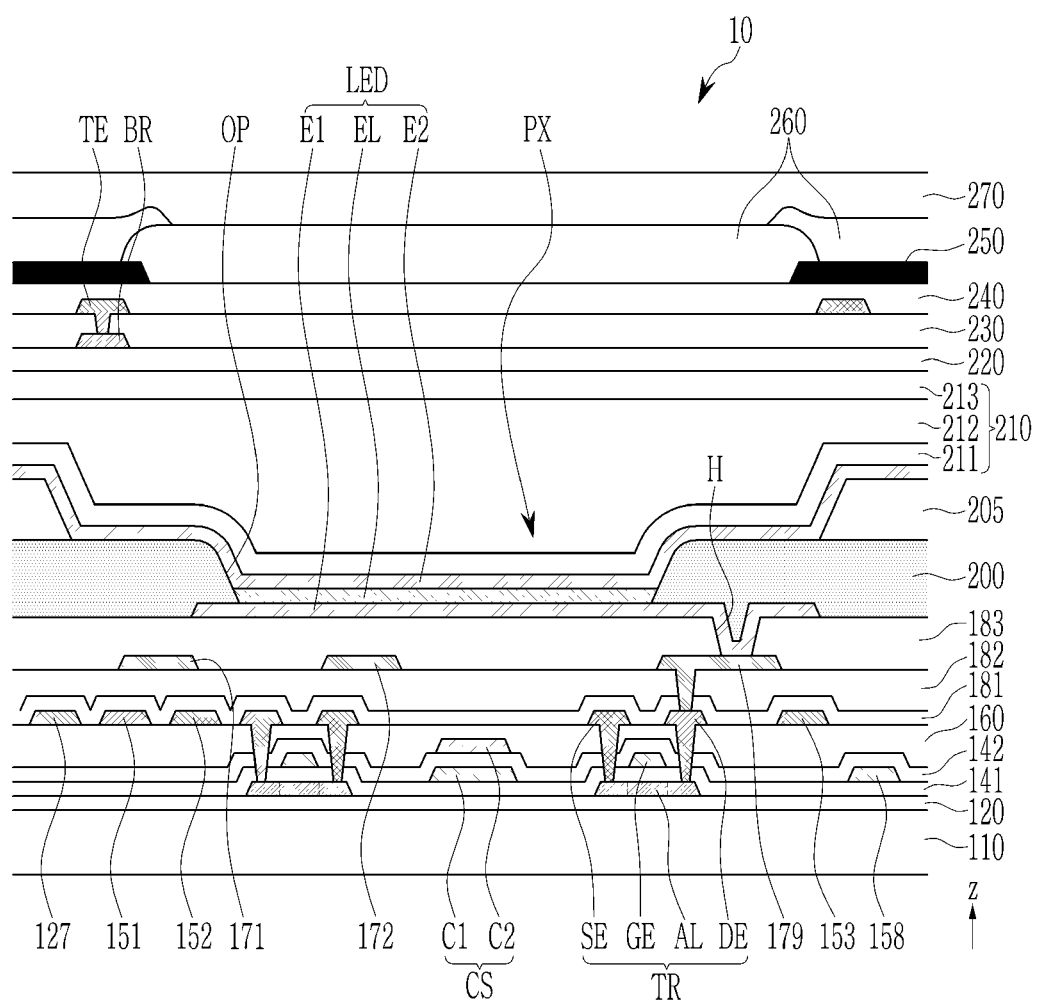
FIG. 15 is a schematic cross-sectional view of one pixel area in a display panel according to some embodiments.

The transistors T1 to T7 include a gate electrode G1 to G7, a first electrode S1 to S7, and a second electrode D1 to D7, respectively, and the storage capacitor CS include a first electrode C1 and a second electrode C2. The electrodes of these transistors T1 to T7 and the storage capacitor CS may be connected as shown in FIG. 15. The anode of the light emitting diode LED may be connected to the second electrode D1 of the driving transistor T1 through the light emitting control transistor T6, and may receive a driving current ID. The cathode of the light emitting diode LED may receive a common voltage ($EL_{VSS}$) (also referred to as a second power voltage or a low potential power voltage).

In the circuit structure of the pixel PX, the number of transistors, the number of capacitors, and the connection between them may be variously modified.

FIG. 15 is a schematic cross-sectional view of one pixel area in a display panel according to some embodiments.

Referring to FIG. 15, a display panel 10 may basically include a substrate 110, a transistor TR formed on the substrate 110, and a light emitting diode LED connected to the transistor TR. The light emitting diode LED may correspond to the pixel PX.

The substrate 110 may be a rigid substrate including glass. The substrate 110 may be a flexible substrate including a polymer such as polyimide, polyamide, or polyethylene terephthalate.

A buffer layer 120 may be positioned on the substrate 110. The buffer layer 120 improves characteristics of a semiconductor layer AL by blocking impurities from the substrate 110 when the semiconductor layer AL is formed, and may relieve a stress of the semiconductor layer AL by flattening the surface of the substrate 110. The buffer layer 120 may include an inorganic insulating material such as a silicon nitride ($SiN_x$), a silicon oxide ($SiO_x$), or a silicon oxynitride ($SiO_xN_y$). The buffer layer 120 may also include amorphous silicon.

The semiconductor layer AL may be positioned on the buffer layer 120. The semiconductor layer AL may include a first region, a second region, and a channel region between these regions. The semiconductor layer AL may include polysilicon, amorphous silicon, or an oxide semiconductor.

A first gate insulating layer 141 may be positioned on the semiconductor layer AL. The first gate insulating layer 141 may include an inorganic insulating material such as a silicon oxide, a silicon nitride, or a silicon oxynitride, and may be a single layer or multiple layers.

A first gate conductive layer that may include the gate electrode GE, the first electrode C1 of the storage capacitor CS, the bypass control line 158, and the like may be positioned on the first gate insulating layer 141. The first gate conductive layer may be formed of the same material in the same process. The gate electrode GE may overlap the channel region of the semiconductor layer AL. The first gate conductive layer may include molybdenum (Mo), aluminum (Al), copper (Cu), titanium (Ti), tungsten (W), and the like, and may be a single layer or multiple layers.

A second gate insulating layer 142 may be positioned on the first gate conductive layer. The second gate insulating layer 142 may include an inorganic insulating material such as a silicon nitride, a silicon oxide, or a silicon oxynitride, and may be a single layer or multiple layers.

A second gate conductive layer that may include a second electrode C2 of the storage capacitor CS and the like may be positioned on the second gate insulating layer 142. The second electrode C2 may overlap the first electrode C1, and the first electrode C1, the second electrode C2, and the second gate insulating layer 142 therebetween may constitute the storage capacitor CS. The second gate conductive layer may be formed of the same material in the same process. The second gate conductive layer may include molybdenum (Mo), aluminum (Al), copper (Cu), titanium (Ti), tungsten (W), and the like, and may be a single layer or multiple layers.

An interlayer insulating layer 160 may be positioned on the second gate conductive layer. The interlayer insulating layer 160 may include an inorganic insulating material such as a silicon nitride, a silicon oxide, or a silicon oxynitride, and may be a single layer or multiple layers. When the interlayer insulating layer 160 is a multilayer, the lower layer may include a silicon nitride and the upper layer may include a silicon oxide.

A first data conductive layer that may include a first electrode SE and a second electrode DE of the transistor TR, an initialization voltage line 127, a scan line 151, a previous scan line 152, a light emitting control line 153, and the like may be positioned on the interlayer insulating layer 160. One of the first electrode SE and the second electrode DE may be a source electrode of the transistor TR, and the other may be a drain electrode of the transistor TR. At least one of the initialization voltage line 127, the scan line 151, the previous scan line 152, or the light emitting control line 153 may be included in the first gate conductive layer or the second gate conductive layer. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), etc., and may be a single layer or a multilayer. For example, the first data conductive layer may have a triple-layer structure such as titanium (Ti)/aluminum (AD/titanium (Ti), or a double-layer structure such as titanium (Ti)/copper (Cu).

A passivation layer 181 may be positioned on the first data conductive layer. The passivation layer 181 may include an inorganic insulating material such as a silicon oxide or a silicon nitride.

A first planarization layer 182 may be positioned on the passivation layer 181. The first planarization layer 182 may include organic insulating materials such as a general-purpose polymer such as poly(methyl methacrylate) and polystyrene, a derivative of a polymer having a phenolic group, an acryl-based polymer, an imide-based polymer (e.g., polyimide), and a siloxane-based polymer.

A second data conductive layer that may include a data line 171, a driving voltage line 172, a connecting member 179, and the like may be positioned on the first planarization layer 182. The connecting member 179 may be connected to the second electrode DE of the transistor TR through a contact hole formed in the first planarization layer 182 and the passivation layer 181. The second conductive layer may further include at least one of the initialization voltage line 127, the scan line 151, the previous scan line 152, or the light emitting control line 153. At least one of the data line 171 or the driving voltage line 172 may be included in the first data conductive layer. The second data conductive layer may be formed of the same material in the same process. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), etc., and may be a single layer or a multilayer. For example, the second data conductive layer may have a triple-layer structure such as titanium (Ti)/ aluminum (AD/titanium (Ti), or a double-layer structure such as titanium (Ti)/copper (Cu).

A second planarization layer 183 may be positioned on the second data conductive layer. The second planarization layer 183 may include organic insulating materials such as a general-purpose polymer such as poly(methyl methacrylate) and polystyrene, a derivative of a polymer having a phenolic group, an acryl-based polymer, an imide-based polymer (e.g., polyimide), and a siloxane-based polymer.

A pixel electrode E1 of the light emitting diode LED may be positioned on the second planarization layer 183. The pixel electrode E1 may be connected to the connecting member 179 through a contact hole H formed in the second planarization layer 183. Since the connecting member 179 is connected to the second electrode DE, the pixel electrode E1 may be electrically connected to the second electrode DE through the connecting member 179. The pixel electrode E1 may be formed of a reflective conductive material or a semi-transmissive conductive material, or may be formed of a transparent conductive material. The pixel electrode E1 may include a transparent conductive material such as indium tin oxide (ITO) or indium zinc oxide (IZO). The pixel electrode E1 may include a metal such as lithium (Li), calcium (Ca), aluminum (Al), silver (Ag), magnesium (Mg), or gold (Au). The pixel electrode E1 may have a multi-layered structure, and for example, may have a triple-layered structure such as ITO/silver (Ag)/ITO. On the other hand, in the aforementioned embodiments of FIG. 9, FIG. 10, FIG. 11, FIG. 12, and FIG. 13, the slit corresponding to the slits S, S1, and S2 of the third pixel PXc may be formed in the pixel electrode E1. Accordingly, the gas that may be emitted from the first planarization layer 182 and the second planarization layer 183 is smoothly discharged through the slit of the pixel electrode E1 when manufacturing, for example, the display panel 10, thereby preventing or reducing shrinkage.

A partition (200, also referred to as a pixel definition layer or a bank) having an opening OP overlapping the pixel electrode E1 may be positioned on the second planarization layer 183. The partition 200 may define a light emitting region. The partition 200 may cover the edge of the pixel electrode E1. That is, the edge of the pixel electrode E1 may be cladded by the partition 200. The partition 200 may include an organic insulating material such as an acryl-based polymer, an imide-based polymer (e.g., polyimide), or an amide-based polymer (e.g., polyamide). The partition 200 may be a black partition including colored pigments such as black pigments and blue pigments. For example, the partition 200 may include a polyimide binder and a pigment mixed with red, green, and blue. For example, the partition 200 may include cardo binder resin and a mixture of lactam black pigment and blue pigment. The partition 200 may include carbon black. The black partition may improve the contrast ratio and prevent or reduce the reflection by the underlying metal layer.

An emission layer EL may be positioned on the pixel electrode E1. The emission layer EL may overlap the aperture OP. The emission layer EL may include a material layer that uniquely emits light of primary colors such as red, green, and blue. The emission layer EL may have a structure in which material layers emitting light of different colors are stacked. On the pixel electrode E1, in addition to the emission layer EL, at least one of a hole injection layer, a hole transport layer, an electron transport layer, or an electron injection layer may be positioned.

A spacer 205 may be positioned on the partition 200. The spacer 205 may support the FMM used during the deposition for the formation of the emission layer EL. The spacer 205 may include an organic insulating material such as an acryl-based polymer, an imide-based polymer, or an amide-based polymer.

A common electrode (E2, also called an opposed electrode) may be positioned on the emission layer EL and the partition 200. The common electrode E2 may be positioned over a plurality of pixels PX. The common electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), or lithium (Li). The common electrode E2 may include a transparent conductive oxide (TCO) such as indium tin oxide (ITO) or indium zinc oxide (IZO).

The pixel electrode E1, the emission layer EL, and the common electrode E2 may constitute a light emitting diode LED, which may be an organic light emitting diode. The pixel electrode E1 may be an anode serving as a hole injection electrode, and the common electrode E2 may be a cathode serving as an electron injection electrode, and vice versa. The opening OP of the partition 200 may correspond to the light emitting region of the light emitting diode LED.

An encapsulation layer 210 may be positioned on the common electrode E2. The encapsulation layer 210 may seal the light emitting diodes and may prevent or reduce penetration of moisture or oxygen from the outside. The encapsulation layer 210 may be a thin film encapsulation layer including at least one inorganic layer and at least one organic layer stacked on the common electrode E2. For example, the encapsulation layer 210 may have a triple layer structure of a first inorganic layer 211, an organic layer 212, and a second inorganic layer 213. The encapsulation layer 210 may be provided in the form of a substrate.

The first insulating layer 220 may be positioned on the encapsulation layer 210. The first insulating layer 220 may cover the encapsulation layer 210 to protect the encapsulation layer 210 and prevent or reduce moisture permeation. The first insulating layer 220 may reduce a parasitic capacitance between the common electrode E2 and the touch electrode TE.

A first touch conductive layer that may include a bridge BR may be positioned on the first insulating layer 220. A second insulating layer 230 may be positioned on the first touch conductive layer. A second touch conductive layer capable of including touch electrodes TE may be positioned on the second insulating layer 230. A passivation layer 240 may be positioned on the second touch conductive layer.

The touch electrodes TE may include first touch electrodes and second touch electrodes forming a mutual sensing capacitor. The bridge BR may electrically connect the first touch electrodes or the second touch electrodes. For example, the adjacent and separated first touch electrodes may be connected to the bridge BR through contact holes formed in the second insulating layer 230, thereby being electrically connected through the bridge BR.

The first insulating layer 220 and the second insulating layer 230 may include an inorganic insulating material such as a silicon nitride, a silicon oxide, or a silicon oxynitride, and may be a single layer or multiple layers. The passivation layer 240 may include an organic insulating material such as an acryl-based polymer or an imide-based polymer, or an inorganic insulating material such as a silicon nitride, a silicon oxide, or a silicon oxynitride.

The first touch conductive layer and the second touch conductive layer may have a mesh shape having an opening overlapping the light emitting region of the light emitting diode LED. The first touch conductive layer and the second touch conductive layer may include a metal such as aluminum (Al), copper (Cu), titanium (Ti), molybdenum (Mo), silver (Ag), chromium (Cr), or nickel (Ni), and may be single-layered or multi-layered. For example, the first touch conductive layer and/or the second touch conductive layer may have a triple-layer structure such as titanium (Ti)/aluminum (AD/titanium (Ti).

A light blocking member 250 may be positioned on the passivation layer 240. The light blocking member 250 may include black pigment and/or black dye, and may reduce or prevent light reflection by a metal layer of the display panel 10 or the like. The light blocking member 250 may be positioned so as not to overlap the opening OP, which is the light emitting region. The light blocking member 250 may be referred to as a black matrix.

A color filter 260 may be positioned on the passivation layer 240. The color filter 260 may transmit any one color among red, green, and blue for example. The color filter 260 representing different colors may overlap in the region overlapping the light blocking member 250.

The color filter 260 and the light blocking member 250 may function as an anti-reflection layer in combination. In such a structure, a polarization layer as an anti-reflection layer may not be required, and thus light output efficiency may be increased and the thickness of the display panel 10 may be reduced. The color filter 260 may include quantum dots or a phosphor, and may convert light emitted from the light emitting diode LED into red or green. An overcoat layer 270 may be positioned on the color filter 260. The display panel 10 may include a polarization layer as an anti-reflection layer.

While this disclosure has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims, and their equivalents.

What is claimed is:

1. A light emitting display device comprising:
    a plurality of pixel areas including a first pixel area and a second pixel area adjacent to the first pixel area;
    a first unit pixel in the first pixel area; and
    a second unit pixel in the second pixel area,
    wherein the first unit pixel and the second unit pixel include a first pixel, a second pixel, and a third pixel each configured to display different colors,
    facing sides of the first pixel and the third pixel have complementary curved lines in the first unit pixel,
    facing sides of the second pixel and the third pixel have complementary curved lines in the first unit pixel, and
    facing sides of the first pixel of the first unit pixel and the second pixel of the second unit pixel have complementary curved lines.

2. The light emitting display device of claim 1, wherein one of the facing sides is a curved line that is concave with respect to a center of a pixel from among the first, second, and third pixels including the one of the facing sides, and another of the facing sides is a curved line that is convex with respect to a center of the pixel including the another of the facing sides.

3. The light emitting display device of claim 2, wherein among the facing sides of the first pixel and the third pixel in the first unit pixel, a side of the first pixel is a concave arc with respect to the center of the first pixel, and a side of the third pixel is a convex arc with respect to the center of the third pixel,
    among the facing sides of the second pixel and the third pixel in the first unit pixel, a side of the second pixel is a concave arc with respect to the center of the second pixel, and the side of the third pixel is a convex arc with respect to the center of the third pixel, and
    among the facing sides of the first pixel of the first unit pixel and the second pixel of the second unit pixel, the side of the first pixel is a convex arc with respect to the center of the first pixel, and the side of the second pixel is a concave arc with respect to the center of the second pixel.

4. The light emitting display device of claim 2, wherein curvature centers of the facing sides of the first pixel and the third pixel in the first unit pixel are the same, curvature centers of the facing sides of the second pixel and the third pixel in the first unit pixel are the same, and curvature centers of the facing sides of the first pixel of the first unit pixel and the second pixel of the second unit pixel are the same.

5. The light emitting display device of claim 2, wherein in the first unit pixel, a first interval between the first pixel and the third pixel is equal to a second interval between the second pixel and the third pixel, and
    a third interval between the first pixel of the first unit pixel and the second pixel of the second unit pixel is equal to the first interval.

6. The light emitting display device of claim 5, wherein the facing sides of the third pixel of the first unit pixel and the second pixel of the second unit pixel are complementary curved lines.

7. The light emitting display device of claim 6, wherein among the facing sides of the third pixel of the first unit pixel and of the second pixel of the second unit pixel, the side of the third pixel is a convex arc with respect to the center of the third pixel, and the side of the second pixel is a concave arc with respect to the center of the second pixel.

8. The light emitting display device of claim 6, wherein a fourth interval between the third pixel of the first unit pixel and the second pixel of the second unit pixel is equal to the first interval.

9. The light emitting display device of claim 1, wherein the plurality of the pixel areas further includes a third pixel area adjacent to the first pixel area in a horizontal direction, the light emitting display device further includes a third unit pixel in the third pixel area, the third unit pixel including a first pixel, a second pixel, and a third pixel that display different colors, and the first pixel is above the second pixel in the first pixel area, and the second pixel is above the first pixel in the second pixel area.

10. The light emitting display device of claim 9, wherein the first pixel area and the third pixel area are at a lower end among the plurality of pixel areas, and the light emitting display device further includes a second pixel spanning the third pixel area at the lower end.

11. The light emitting display device of claim 1, wherein a slit extending in an oblique direction is formed in the third pixel.

12. The light emitting display device of claim 11, wherein the slit is formed to divide the third pixel into two portions, or the slit is formed to be recessed from one side or both facing sides of the third pixel.

13. The light emitting display device of claim 1, wherein the second pixel is larger than the first pixel, and the third pixel is larger than the second pixel.

14. The light emitting display device of claim 1, wherein the first pixel, the second pixel, and the third pixel represent red, green, and blue, respectively.

15. An electronic device comprising:
a light emitting display device comprising:
a first unit pixel in a first pixel area; and
a second unit pixel in a second pixel area adjacent to the first pixel area,
the first unit pixel and the second unit pixel include a first pixel, a second pixel, and a third pixel each displaying different colors, a first interval between the first pixel and the third pixel in the first unit pixel, a second interval between the second pixel and the third pixel in the first unit pixel, and a third interval between the first pixel of the first unit pixel and the second pixel of the second unit pixel are the same.

16. The electronic device of claim 15, wherein
in the first unit pixel, facing sides of the first pixel and the third pixel are complementary curved lines, and facing sides of the second pixel and the third pixel are complementary curved lines, one of the facing sides is a curved line that is concave to a center of the pixel including the one of the facing sides, and another of the facing sides is a curved line that is convex to a center of the pixel including the other.

17. The electronic device of claim 16, wherein
among the facing sides of the first pixel and the third pixel in the first unit pixel, a side of the first pixel is a concave arc with respect to the center of the first pixel, and a side of the third pixel is a convex arc with respect to the center of the third pixel, and among the facing sides of the second pixel and the third pixel in the first unit pixel, a side of the second pixel is a concave arc with respect to the center of the second pixel, and the side of the third pixel is a convex arc with respect to the center of the third pixel.

18. The electronic device of claim 16, wherein
curvature centers of the facing sides of the first pixel and the third pixel in the first unit pixel are the same, and curvature centers of the facing sides of the second pixel and the third pixel in the first unit pixel are the same.

19. The electronic device of claim 15, wherein
facing sides of the third pixel of the first unit pixel and the second pixel of the second unit pixel are complementary curved lines, among the facing sides of the third pixel of the first unit pixel and the second pixel of the second unit pixel, a side of the third pixel is a convex arc with respect to a center of the third pixel, and a side of the second pixel is a concave arc with respect to a center of the second pixel.

20. The electronic device of claim 19, wherein
curvature centers of the facing sides of the third pixel of the first unit pixel and the second pixel of the second unit pixel are the same.

* * * * *